June 24, 1969 C. R. RYAN 3,452,289

DIFFERENTIAL AMPLIFIER CIRCUITS

Filed Feb. 16, 1967

INVENTOR.
Carl R. Ryan

BY
Mueller, Aichele & Rauner
ATTYS.

United States Patent Office 3,452,289

Patented June 24, 1969

3,452,289

DIFFERENTIAL AMPLIFIER CIRCUITS

Carl R. Ryan, Mesa, Ariz., assignor to Motorola, Inc., Franklin Park, Ill., a corporation of Illinois Filed Feb. 16, 1967, Ser. No. 616,506
Int. Cl. H03f 1/08, 1/34
U.S. Cl. 330—23 9 Claims

ABSTRACT OF THE DISCLOSURE

A differential amplifier tree arrangement having a base differential amplifier with two active elements sharing a received constant current with each of the elements respectively supplying its passed currents to a pair of separate upper differential amplifiers, each of the three differential amplifiers may be independently controlled. Output signals of the upper two differential amplifiers are inter-connected in such a way that when the base amplifier switches from one upper differential amplifier to the other, there are insubstantial, if any, transients induced in the linear signals being processed through the differential amplifier tree.

*Background of the invention*

This invention relates to gain controlled amplifiers and more particularly to such amplifiers employing differential circuits in a tree arrangement and capable of being incorporated in microminiature or integrated circuit packages.

Most broad band linear signal processing systems require two types of amplifier devices for processing functions. These devices are commonly referred to as limiting amplifiers and gain controlled amplifiers. Variations of amplifiers of these two types of devices are required only to optimize system design in terms of total power consumption. In such systems it is also desirable that they be broad band; for example, DC to 500 megahertz and higher.

In making a device into a microminiature circuit, such microminaturized device should still be capable of performing all the functions as good or better than the corersponding device constructed with discrete component parts; a minimum of discrete components should be required to construct the entire signal processing system such that maximum advantage may be obtained from monolithic techniques. All such devices should interface with logic or digital switching circuits and easily with circuits involving discrete components, and should have desirable characteristics such that a signal processing system may be designed with a high degree of confidence in obtaining selected results.

A gain controlled amplifier can be interconnected with itself and other devices to perform filter functions, phase modulation and demodulation functions, frequency mixing functions, integration, fast switching and other circuit functions too numerous to mention.

In performing the above described functions, it is often required that a gain controlled amplifier circuit rapidly change its electrically conductivity including switching conductivity states. (Switching is a non-linear circuit operation.) Also, when constructed using differential amplifier arrangements it will be conduction in one or both sides of the differential amplifier pair of active elements. When switching or rapidly changing conduction from one side to the other, it has been found that undesired transients may be introduced into linear or analog signal processing systems. Other known gain control amplifiers and switches capable of performing the operations described above often have required balanced transformers or on the other hand do not attain the speed or accuracy (linearity) capabilities desired in such signal processing systems.

Other forms of gain controlled amplifiers including single ended operation and with emitter follower output have usually had poor common mode rejection and inherent instability of the emitter-follower when driving reactive loads encountered in general purpose ratio frequency applications. Further, such devices should selectively exhibit special non-linearities such as required for frequency mixers, automatic gain control circuits and phase detectors. Also, such devices should be capable of being used in hybrid (that is, analog and digital combined signal processing at the interface between the analog or linear signals) processing systems and a digital processing or signal switching system.

*Summary of the invention*

It is an object of this invention to provide a gain controlled amplifier capable of switching two analog or other linear signals as a single pole double throw switch for signals from DC to greater than 500 megahertz with time for example of less than 2 nanoseconds.

It is a further object of this invention to provide a gain controlled amplifier circuit capable of a comparison type of operation to be performed at frequencies of at least 500 megahertz.

It is a further object of this invention to provide a gain controlled amplifier universal circuit package utilizing differential amplifier circuits having a wide variety of applications and combinations in linear signal processing systems as well as linear and digital switching systems having combined signals.

It is another object of this invention to provide a gain controlled amplifier having good linearity over a wide band of frequencies.

This invention is embodied in apparatus featuring a base or lower differential amplifier receiving a constant current drive with a pair of independent control inputs for a differential pair of active elements. On each pair there are connected first and second upper differential amplifiers for receiving currents from the respective lower amplifier elements and each of the first and second upper differential amplifiers having control inputs. The output portions of the upper differential amplifiers are selectively interconnected to form two output circuits having differential output signals. When the lower differential amplifier switches conductivity between its two active elements, the input and output connections of the upper differential amplifier are so arranged such that the constant current provided to the differential amplifiers inhibits generation of transients caused by rapid conductivity changes within the differential amplifiers.

*Description of the illustrative embodiments*

Figure 1:
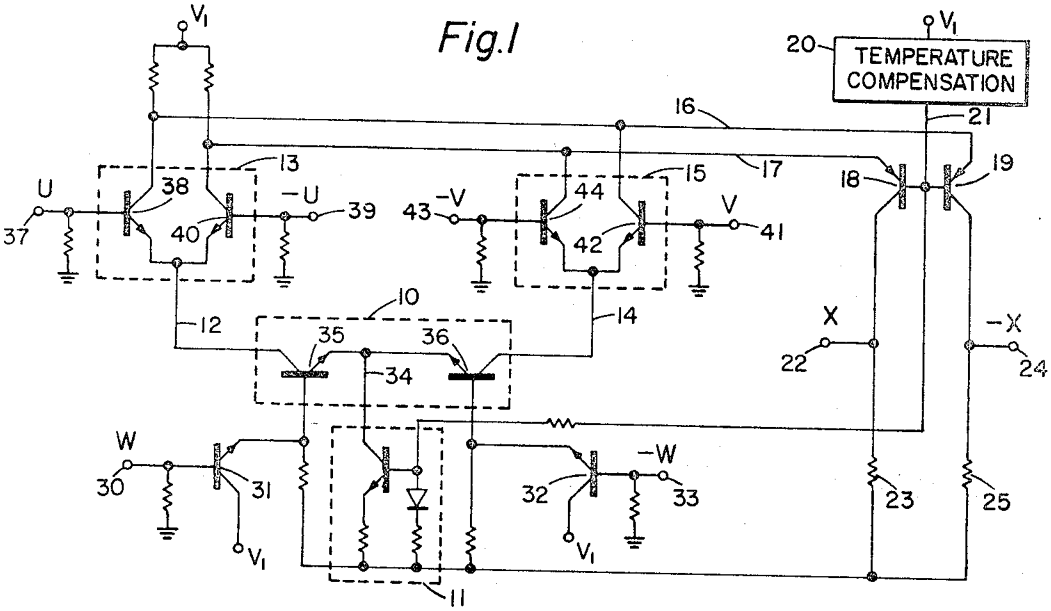
FIG. 1 is a simplified schematic diagram of a differential amplifier tree circuit embodying the teachings of this invention.

FIG. 1 illustrates an embodiment of the present invention in which a base or lower differential amplifier 10 receives a constant current from source 11 to provide common mode rejection and inhibit transient generation as later referred to. Line 12 connects one side of differential amplifier 10 to a first upper differential amplifier 13 for supplying current thereto and thereby controlling the gain of that differential amplifier according to the conductively of one side of amplifier 10. In a similar manner a second side amplifier 10 is connected over line 14 to a second upper differential amplifier 15 for controlling its gain differentially with respect to the controlled gain of amplifier 13. The amplifier circuit may have a temperature compensated network 20, which may include a semiconductor diode, supplying its control signal over line 21 to constant current source 11 in any known manner. The output signals of the circuit are taken from upper differential amplifier 13 and 15 over output lines 16 and 17. Signals on output lines 16 and 17 emitter drive output transistors 18 and 19 which have their base electrodes connected together and to temperature compensation network 20. The output signals are taken from the collectors of transistors 18 and 19 via terminals 22 and 24 with output voltages being generated across load resistors 23 and 25, respectively. Terminal 22 supplies a so-called non-complementary output signal termed "$x$" while terminal 24 provides the opposite phase output signal or complimentary signal termed "$-x$".

Input signals are supplied to lower differential amplifier 10 termed "$w$" and "$-w$", through terminal 30 and emitter-follower input circuit 31 and terminal 33 and emitter-follower input circuit 32. The minus sign indicates opposite phase. Input terminal 33 is shown as being connected to ground reference potential for amplifier 10 to receive a single ended input on terminal 30. It is understood that a differential or double ended input may be supplied to amplifier 10 across terminals 30 and 33 in a known manner. A slight increase in gain is provided when a double ended input is used instead of a single ended input.

The constant current supplied to lower differential amplifier 10 over line 34 from source 11 is divided between the amplifier to active transistor elements 35 and 36, respectively. As the conductivity of the transistor elements 35 and 36 are respectively changed by input signals between terminals 30 and 33, the gain of the upper differential amplifiers 13 and 15 are respectively and differentially changed. Because of the single constant current flowing to the differential amplifier tree, insignificant noise transients, if any, are introduced into lines 16 and 17 by the switching or other conductivity changing action of amplifiers 10, 13 and 15.

Amplifier 13 has a pair of input terminals 37 and 39 respectively connected to transistor elements 38 and 40 comprising the opposite sides of that differential amplifier. Terminal 37 receives the "$u$" input signal whereas terminal 39 receives the "$-u$" signal. The minus sign indicates opposite phase. As illustrated, the circuit is designed to receive a single ended input on terminal 37 with terminal 39 connected to ground reference potential. Transistors 38 and 40 have the usual collector load resistors connected to a supply $V_1$.

Differential amplifier 15 receives "$v$" input signal on terminal 41 to drive transistor 42 forming one side of the differential amplifier. Input terminal 43, termed "$-v$," is connected to ground reference potential via a small resistance for supplying a reference voltage to transistor 44 which forms the other side of differential amplifier 15. Double ended input signals may also be supplied to terminals 41 and 43. The collectors of transistors 42 and 44 are connected respectively to lines 16 and 17 and to the collectors of transistors 38 and 40.

In explaining the operation of the circuit first assume that transistor 35 is conduction current equal to the constant current supplied over line 34. By well known differential action, transistor 36 is conducting no current. This conductivity state of differential amplifier 10 provides maximum gain to amplifier 13 by supplying maximum current over line 12 whereas differential amplifier 15 is blocked off and supplying no current signals to the output because of no current over line 14 (zero gain).

Next assume the input signal at terminal 30 is changing such that transistor 35 is being driven toward voltage saturation, i.e., current cut-off. As the current through transistor 35 decreases, the gain of differential amplifier 13 is correspondingly decreased and simultaneously therewith the current through transistor 36 and thence line 14 is correspondingly differentially increased, yielding increasing gain to differential amplifier 15. Since the current on line 34 is constant, the sum of the gains of amplifiers 13 and 15 always equals a constant, i.e., where A is a symbol for gain:

$$A_{13}+A_{15}=2K \qquad (1)$$

where K is a constant. Therefore, when differential amplifier 10 switches conductivity states between transistors 35 and 36, the output terminals 22 and 24 receive output signals first from amplifier 13 and then from amplifier 15 for switching the output signals between the $u$ and the $v$ input signals without introducing extraneous transients. While the change in conductivity of differential amplifier 10 has been described in terms of current saturation switching, no limitation thereto is intended. Saturation switching has been used as an illustration to show the extreme changes in conductivity which still provide no transients during switching action between voltage and current saturation of differential amplifier 10. As the changes in conductivity of amplifier 10 are reduced, increased linearity of operation is provided. The significance of the above statement will become more clear from continued reading of the specification.

Figure 2:
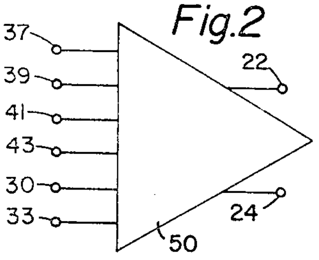
FIG. 2 is a block diagram symbol illustrating the functional aspects of the FIG. 1 circuit as used in other FIGS. of the application.

Referring next to FIG. 2 there is shown a block diagram repesentation of the FIG. 1 circuit. The amplifier tree is represented by triangle 50 having a plurality of inputs with number corresponding to the terminal numbers of FIG. 1; i.e., 30, 33, 37, 39, 41 and 43, and output terminals 22 and 24. In subsequent FIGS. the terminals 30 through 37 are represented by the small alphabetical characters inside the triangular block symbol while the $x$ output will always be represented by a line leaving the upper side of the symbol and the $-x$ output leaving the lower side of the triangular symbol.

Figures 3, 4:
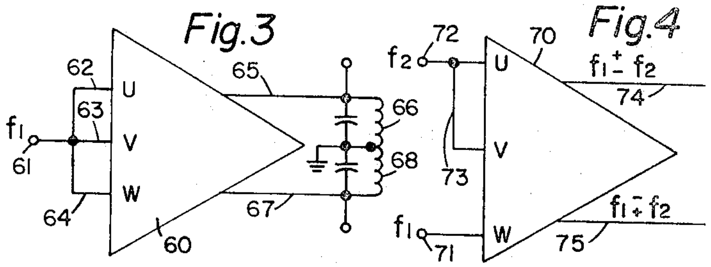
FIG. 3 is a block diagram simplified illustration of the FIG. 1 circuit connected as a harmonic generator.
FIG. 4 is a simplified block schematic showing of the FIG. 1 circuit used as phase demodulator and also as a mixer.

Referring now to FIG. 3 there is shown in combined block and schematic form a harmonic generator. When this circuit is operated in a linear mode the circuit output signal is almost a pure harmonic ($N=2$) of the input signal while odd order harmonics including the fundamental will be down greater than 30db below the second order harmonic even without filtering. Triangular symbol 60 represents the amplifier configuration having $u$, $v$ and $w$ inputs with the negative inputs $-u$, $-v$, and $-w$ being grounded and not shown for simplicity. An input signal having a frequency $f_1$ (wave 61A of FIG. 3A) which may be a sine wave, is supplied via terminal 61 and lines 62, 63 and 64 to all three undergrounded input connections. The amplifier tree is operated in a linear or non-saturated mode with output signals (wave 65A of FIG. 3A being the $x$ output signal) being supplied over lines 65 and 67. Referring to FIG. 1 now, transistor 35 is connected to the emitters of transistors 38 and 40 of amplifier 13 while transistor 36 is connected to the emitters of transistors 42 and 44 of amplifier 15. The two sides of the amplifier tree, i.e., amplifiers 13 and 15, cooperate in a differential manner as driven by amplifier 10 to supply the second harmonic signal without extraneous transients because of the cooperative relationship afforded between the constant current and differential action of the amplifier tree.

The frequency multiplicative coaction between amplifier 13 and amplifier 10 acting through transistor 35, is best understood by referring to the trigometric functions of a single sine wave input to both amplifiers. It is understood that other wave forms will produce relatable results. Assume that the input to terminals 30 and 37 is:

$$V_{in}=\sin wt \quad (2)$$

Since transitor 35 modulates the gain of amplifier 30, it is equivalent of multiplying the two input waves together yielding:

$$V_{out}-\sin wt \sin wt \quad (3)$$

This product reduces in trigometric form to an output wave form:

$$V_{out}=\sin 2wt+V_{DC} \quad (4)$$

which is the second harmonic with a DC component. Because of the differential action and the constant current from line 34, transistor 36 has a conductivity and resulting current according to:

$$I(1-\sin wt) \quad (5)$$

where I is the constant current. The two upper differential amplifiers are tied together with their respective collectors of transistors 38 and 42 (sin 2*wt*) and transistors 40 and 43 to produce the second harmonic as just described.

Figures 3A, 3B:
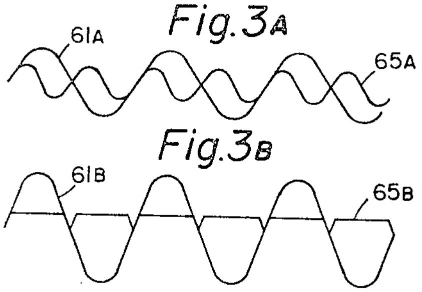
FIG. 3A shows waveforms of the FIG. 3 circuit operating as times two frequency multiplier.
FIG. 3B shows waveforms of the FIG. 3 circuit when operated as an even order harmonic generator.

When FIG. 3 frequency multiplier receives a current saturating input signal 61B of FIG. 3B, the high order even harmonics of the input signal are accented. Input signal 61B overdrives the amplifier tree to produce output signal 65B. To ones skilled in the art, output signal 65B is recognized as primarily containing even harmonics. Filtering is necessary to select the desired even harmonic. In FIG. 3 filter 66 is connected to line 65 to selected one even harmonic, for example, the fourth, while filter 68 on line 67 may accent the sixth harmonic, for example.

Figure 4A:
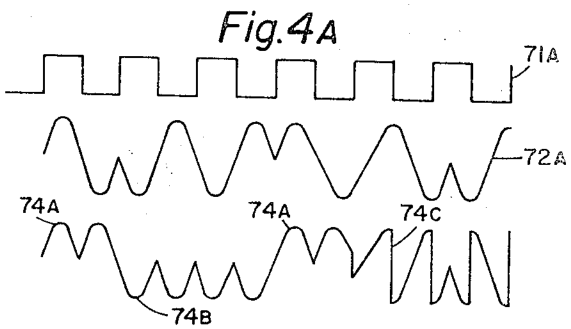
FIG. 4A is a graphical presentation of idealized waveforms used to describe the FIG. 4 circuit operation.

Referirng next to FIGS. 4 and 4A, the connections of the FIG. 1 circuit are described which form a mixer or a phase demodulator depending on the input signals. Linear mixer operation will be first described. Triangular shaped symbol 70 represents the FIG. 1 amplifier which receives a first frequency signal, $f_1$, on terminal 71 connected to the *w* input. A second frequency signal, $f_2$, is supplied to both *u* and *v* inputs via input terminal 72. Therefore both of the upper differential amplifiers receive the second frequency $f_2$ which in combination with the lower differential amplifier 10 provides the sum and difference frequencies on both output lines 74 and 75. Referring momentarily to FIG. 1, the input signal, sin wt, on input terminal 30 modulates the gain of differential amplifier 13 and thereby adds and subtracts to the frequency input on terminal 37 in a well known manner. In the same manner, the signal supplied over line 14 by amplifier 10 adds and subtracts to the input signal on terminal 30. Such line 14 signal is the difference current in transistor 36 caused by subtracting the transistor 35 current from the line 34 constant current.

The same connection can be used to form a phase demodulator wherein a phase modulated carrier signal 72A (FIG. 4A) is supplied to terminal 72 and a digital demodulating signal or clock 71A is supplied to terminal 71. Rectangular clock wave 71A rapidly switches the conductivity between the upper differential amplifiers 13 and 15 (FIG. 1). When the rectangular wave 71A is in phase with the wave 72A the output signal is positive as shown by wave 74A; when 180° out-of-phase, the output signal is negative, as are portions 74B. When the phases of the signals 71A and 72A are intermediate 0 and 180° phase difference there are an alternating polarity signal as at 74C. The phase relationships of waves 71A and 72A are thereby indicated in the output signal. Operation of the amplifier tree with the above input signals are apparent from the preceding description.

Figure 5:
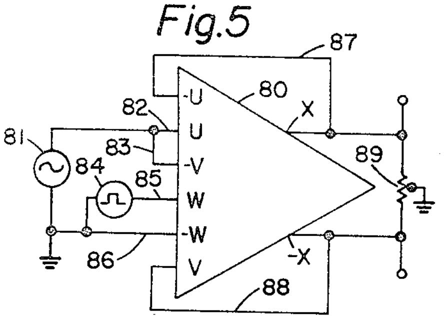
FIG. 5 is a simplified block diagram illustration of a phase detector using the FIG. 1 illustrated circuit.

Referring next to FIG. 5 there is shown a phase detector circuit connection having negative feedback for DC stability. Operation of the circuit is described using the FIG. 4A waveforms. A rectangular wave 71A (FIG. 4A) from source 84 is supplied over line 85 to input *w* with $-w$ input grounded as at 86. The differential amplifier 10 (FIG. 1) switches conductivity states between amplifiers 13 and 15 causing first one and then the other to conduct all of the constant current from source 11 (FIG. 1). The analog signal 72A (FIG. 4A) the phase of which is to be compared with the rectangular switching wave 71A is supplied by source 81 over lines 82 and 83, respectively, to the *u* and $-v$ inputs. The output waves at *x* and $-x$ are respectively provided over lines 87 and 88 to the $-u$ and *v* inputs as negative feedback signals. Center taped resistance 89 acts as a load to develop output signal 74 in the same manner as the FIG. 4 circuit but with added DC stability.

Figure 6:
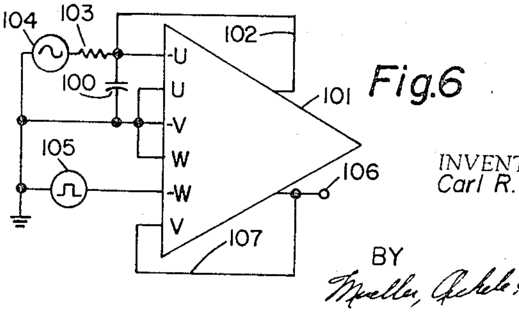
FIG. 6 is a PCM integrating detector circuit utilizing the FIG. 1 illustrated circuit.

Referring next to FIG. 6 there is shown the FIG. 1 circuit connected as a matched filter and usable for pulse code modulation (PCM) detection. Such a dector connection has been used for detecting 100 million bits per second. In this arrangement an output signal is supplied as a pulse having a rise time approximately 0.5 nanosecond with a duration of approximately 2 nanoseconds. The polarity of the output signal is determined by the polarity of charge voltage across storage capacitor 100 connected between the $-u$ and $-v$ inputs, i.e., between two inputs of the upper differential amplifiers of FIG. 1. Block symbol 101 represents the FIG. 1 circuit with line 102 providing a connection from the *x* terminal to the $-u$ input and to one side of the integrating capacitor 100. Inputs *u*, $-v$ and *w* are all connected to ground reference potential as is one side of the integrating capacitor 100. When the source 105 supplied rectangular wave is positive, no current flows to differential 13 (FIG. 1) permitting an input signal from source 104 to charge capacitor 100 through resistor 103. When source 105 clock signal switches to negative signal state, capacitor 100 is discharged through the $-u$ input of amplifier 101 supplying an output signal on line 106 indicative of the charge state of capacitor 100 and also over line 107 as a negative input feedback to the *v* input. Source 105 in keeping transistor 35 (FIG. 1—the $-w$ input) at current non-conduction permits the signal from source 104 to charge and store signal and capacitor 100 for integrating the PCM code for determining the binary information represented therein.

I claim:

1. A differential amplifier type signal processing circuit, including the combination, a current source for supplying a constant amplitude current, a lower differential amplifier having first and second matched transistor elements each having collector, base and emitter electrodes with the emitter electrodes being joined and electrically connected to said constant current source for sharing such constant current, first and second upper linear differential amplifiers each having first and second transistor elements with collector, base and emitter electrodes and emitter electrodes of said transistor elements in the respective upper differential amplifiers being joined together and connected respectively to said collector electrodes of said first and second transistors in said lower differential amplifier, the collector electrodes of said first transistors of said upper differential amplifiers being connected together and the collector electrodes of said second transistors being connected together, said base electrodes of said first transistors of said upper differential amplifier being connected together, input signal means connected to the base electrodes of said lower differential amplifier, another input signal means connected to the base electrodes of said first transistors in said upper differential amplifiers and further electrical connections to said base electrodes of said second transistors in said upper differential amplifier, and output circuit means connected to said collector electrodes of said first and second transistors.

2. The combination of claim 1 wherein said first output connection is connected to said second input connection of said first upper linear differential amplifier for providing a negative feedback connection.

3. The combination of claim 6 wherein said second output connection is connected to said first input connection of said second upper linear differential amplifier for providing a negative feedback connection thereto.

4. The combination of claim 2 further including a capacitor connected between said second output connection and said input connection of said second upper linear differential amplifier.

5. The combination of claim 1 wherein one input connection from said first and second upper amplifiers are connected together and to an input connection of said first active element of said lower differential amplifier, all other input connections being connected to a reference potential such that a second harmonic of any input signal is supplied to both output connections.

6. The combination of claim 1 wherein said first and second upper differential amplifiers each have said first input connections respectively connected together for receiving a first frequency signal, one of said input connections to said lower differential amplifiers being for receiving a second signal, all other input connections being grounded such that the sum and difference frequencies are supplied on the output connections.

7. The combination of claim 6 wherein said first output connection is connected to an input connection of said first upper amplifier and said second output connection is connected to an input connection of second upper amplifier.

8. A differential amplifier type signal processing circuit, including in combination, a current source for supplying a constant amplitude current, a lower differential amplifier having first and second active controllable elements, each element comprising a transistor with a collector, base and emitter electrodes with said emitter electrodes being connected together and to said constant current source and said base electrodes being input connections for selectively controlling said transistors to selectively pass divided portions of said constant current to the collector electrodes, respectively, first and second upper linear differential amplifiers each having first and second controllable active elements with each element consisting of a transistor having emitter electrodes commonly connected together and having base electrodes forming input connections and collector electrodes forming output connections, said emitter electrodes in the respective first and second upper differential amplifiers being respectively electrically connected to said collector electrodes of the transistors in said lower differential amplifier for respectively passing divided portions of said constant current, the collector electrodes of said first transistors in said first and second upper differential amplifiers being connected together and said collector electrodes of said second transistors in said second upper differential amplifiers being connected together, all of said transistors being of the same type and having matched electrical characteristics, temperature compensation means connected to said constant current source and additionally an output circuit having active transistor elements therein respectively connected to said collector electrodes of said upper differential amplifiers and said temperature compensation means being connected to said active transistor elements of said output circuit for providing temperature compensation control thereto.

9. A signal processing circuit, including the combination, a first differential amplifier having first and second semiconductor devices with emitters connected together; each device having a control electrode for receiving a first input signal and a collector electrode, second and third differential amplifiers respectively having third and fourth semiconductor device and fifth and sixth semiconductor devices, each device having collector, control and emitter electrodes with the emitter electrodes of the transistors in said second and third differential amplifiers being connected together, respectively, and also respectively connected to said collector electrodes of said first and second semiconductor devices, said control electrodes of said third and fifth semiconductor devices being connected together for receiving a second input signal, said collector electrodes of said third and sixth semiconductor devices being joined together for forming a first output terminal, said collector electrodes of said fourth and fifth semiconductor devices being joined together to form a second output terminal, feedback means respectively connecting said first output terminal to said control electrode of said sixth semiconductor device and said second output terminal to said control electrode of said fourth semiconductor device, and said first and second semiconductor devices being responsive to said first input signal to alternately switch between current conductive and nonconductive states and said second input signal being a linear signal.

References Cited

UNITED STATES PATENTS

| | | | |
|---|---|---|---|
| 3,188,576 | 6/1965 | Lewis | 330—23 |
| 3,241,078 | 3/1966 | Jones. | |
| 3,290,520 | 12/1966 | Wennik. | |

OTHER REFERENCES

Brugger, "Extending An Operational Amplifier's Band Width to 50–Mc," Electronic Design, May 25, 1964, pp. 50–52, 54–55.

ROY LAKE, *Primary Examiner.*

JAMES B. MULLINS, *Assistant Examiner.*

U.S. Cl. X.R.

325—103; 330—18, 28, 29, 30